United States Patent
Shiratake (10) Patent No.: US 6,937,498 B2
(45) Date of Patent: Aug. 30, 2005

(54) SEMICONDUCTOR INTEGRATED CIRCUIT DEVICE

(75) Inventor: Shinichiro Shiratake, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 38 days.

(21) Appl. No.: 10/269,968

(22) Filed: Oct. 15, 2002

(65) Prior Publication Data

US 2003/0071670 A1 Apr. 17, 2003

(30) Foreign Application Priority Data

Oct. 16, 2001 (JP) .......................................... 2001-318366
Sep. 13, 2002 (JP) .......................................... 2002-268190

(51) Int. Cl.[7] .............................................. G11C 11/00
(52) U.S. Cl. ...................... 365/145; 365/226; 365/227; 365/229
(58) Field of Search ................................ 365/145, 226, 365/227, 229

(56) References Cited

U.S. PATENT DOCUMENTS

| | | | |
|---|---|---|---|
| 5,574,679 A | * | 11/1996 | Ohtsuki et al. ............. 365/145 |
| 5,943,257 A | | 8/1999 | Jeon et al. |
| 6,091,624 A | * | 7/2000 | Kang ......................... 365/145 |
| 6,201,731 B1 | * | 3/2001 | Kamp et al. ............ 365/185.02 |
| 6,288,961 B1 | * | 9/2001 | Tanaka et al. .............. 365/210 |
| 6,335,877 B1 | * | 1/2002 | Kang ......................... 365/145 |

FOREIGN PATENT DOCUMENTS

| | | | | |
|---|---|---|---|---|
| JP | 408055484 A | * | 2/1996 | ............ G11C/14/00 |
| JP | 10-255483 | | 9/1998 | |
| JP | 11-154390 | | 6/1999 | |
| JP | 02000077982 A | * | 3/2000 | ............ H03K/3/037 |

* cited by examiner

Primary Examiner—Viet Q. Nguyen
(74) Attorney, Agent, or Firm—Oblon, Spivak, McClelland, Maier & Neustadt, P.C.

(57) ABSTRACT

A semiconductor integrated circuit device includes connected TC unit type ferroelectric memory which includes series connected memory cells each having a cell transistor having a source terminal and a drain terminal and a ferroelectric capacitor inbetween the two terminals, a first power supply circuit which generates a first power supply potential supplied to the gate of the cell transistor when the cell transistor is in a standby state, and a second power supply circuit. The second power supply circuit generates a second power supply potential supplied to the source or drain of the cell transistor and starts operating following the start-up of the first power supply circuit after a power-on.

16 Claims, 11 Drawing Sheets

SEMICONDUCTOR INTEGRATED CIRCUIT DEVICE

CROSS-REFERENCE TO RELATED APPLICATIONS

This application is based upon and claims the benefit of priority from the prior Japanese Patent Applications No. 2001-318366, filed Oct. 16, 2001; and No. 2002-268190, filed Sep. 13, 2002, the entire contents of both of which are incorporated herein by reference.

BACKGROUND OF THE INVENTION

1. Field of the Invention

This invention relates to a semiconductor integrated circuit device, and more particularly to a semiconductor integrated circuit device including ferroelectric memory cells.

2. Description of the Related Art

Nonvolatile semiconductor memory devices have recently been widely applied to portable apparatuses, mobile cards, and the like, since the stored data is held in the chips even when no power is supplied.

One of the nonvolatile semiconductor memory devices is a ferroelectric semiconductor memory. The ferroelectric semiconductor memory has the advantage of having higher reading and writing speeds than a flash memory. However, it has disadvantages in that, when a voltage is applied to the ferroelectric capacitor of a memory cell, for example, the amount of polarization decreases, which destroys the stored data. For this reason, when the power supply potential in the chip fluctuates, immediately after the power supply is turned on, for example, the control circuit for the ferroelectric capacitor has to be designed to prevent a voltage from being applied to the capacitor.

The possibility that the stored data will be destroyed becomes stronger when unexpected noise occurs on word lines or plate lines. Therefore, the word-line control circuit and plate-line control circuit have to be especially designed to prevent noise from occurring.

Figure 14:
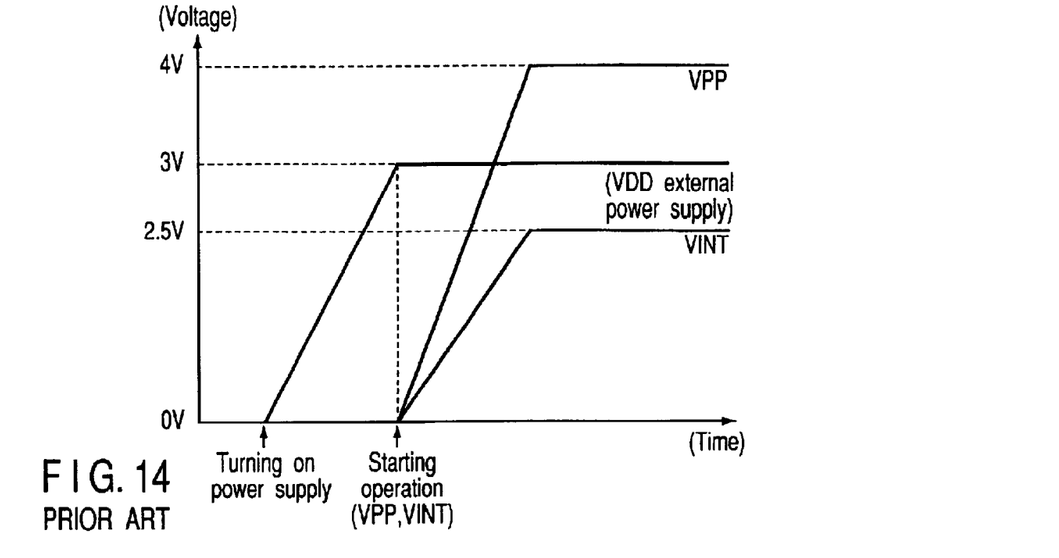
FIG. 14 is a potential waveform diagram showing typical power supply potential waveforms in the chip immediately after the power supply for the ferroelectric semiconductor memory.

FIG. 14 is a potential waveform diagram of a typical power supply potential waveform in the chip immediately after the power supply for a ferroelectric semiconductor memory is turned on.

In a conventional ferroelectric semiconductor memory, when an external power supply VDD has been turned on and the potential of the external power supply VDD has increased from 0V and reached a certain potential, a plurality of power supply circuits provided for corresponding potentials used in the chip are started at the same time.

FIG. 14 shows a case where, when the potential of the external power supply VDD has reached 3V after the turning on of the external power supply VDD, a VPP power supply circuit and a VINT power supply circuit are started at the same time. When the VPP power supply circuit and VINT power supply circuit have been started simultaneously, the potentials of the internal power supplies VPP, VINT start to rise toward their setting potentials at the same time. One example of the setting potential of the internal power supply VPP is 4V. One example of the setting potential of the internal power supply VINT is 2.5V.

Figure 15:
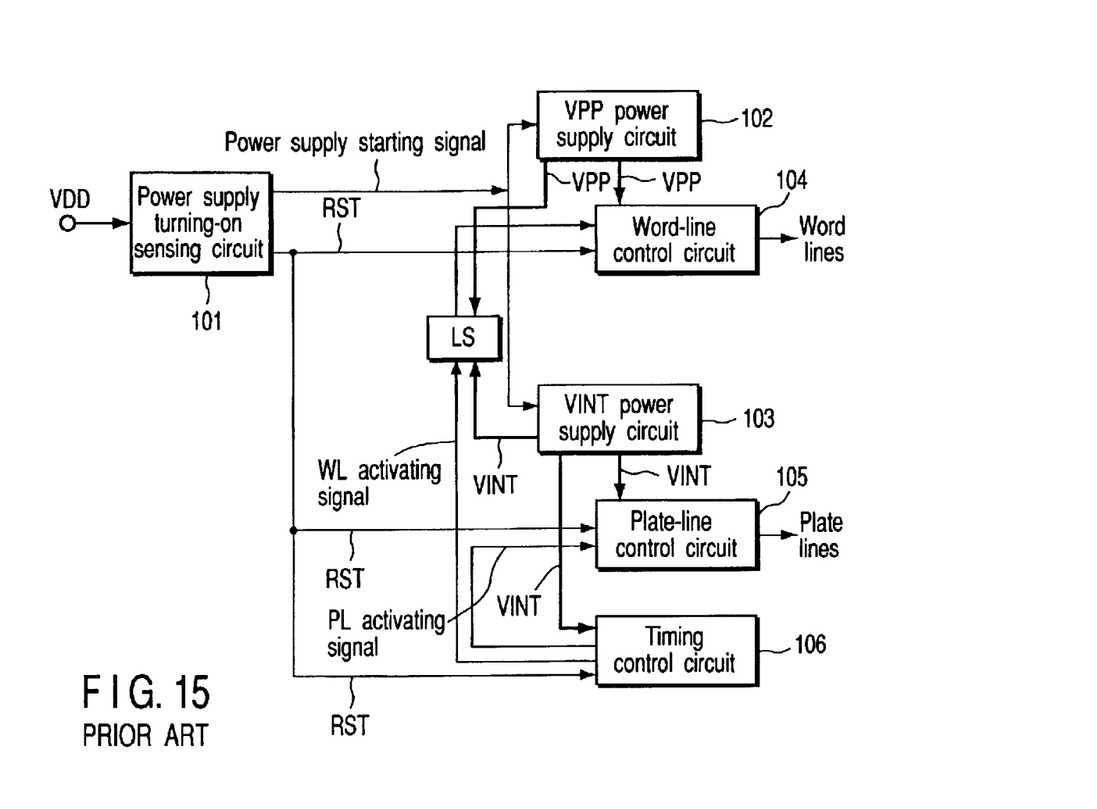
FIG. 15 is a block diagram showing a typical configuration of the ferroelectric semiconductor memory.

FIG. 15 is a block diagram showing a typical configuration of a ferroelectric semiconductor memory.

As shown in FIG. 15, a VPP power supply circuit 102 generates an internal power supply VPP. The internal power supply VPP is supplied to the word lines and a word-line control circuit 104 that controls the word lines.

A VINT power supply circuit 103 generates an internal power supply VINT. The internal power supply VINT is supplied to the plate lines, a plate-line control circuit 105 that controls the plate lines, and a logic circuit group that controls the operation of the entire chip, for example, a timing control circuit 106.

The timing control circuit 106 outputs a WL activating signal and a PL activating signal. The WL activating signal is supplied to the word-line control circuit 104. The PL activating signal is supplied to the plate-line control circuit 105.

Figure 16:
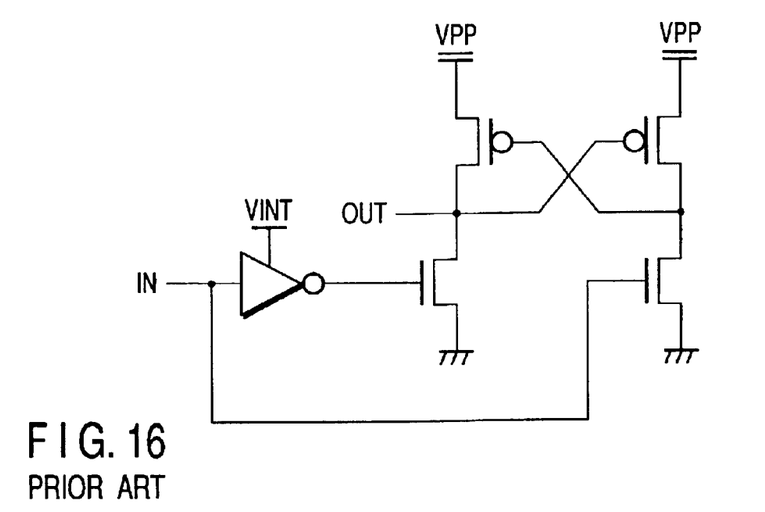
FIG. 16 is a circuit diagram of a typical potential amplitude converting circuit included in the ferroelectric semiconductor memory.

The word-line control circuit 104, which is activated on the basis of, for example, the WL activating signal, controls the potential of the word lines. Before being supplied to the word-line control circuit 104, the WL activating signal passes through a potential amplitude converting circuit LS. The reason for this is that the timing control circuit 106 operates from the internal power supply VINT and the word-line control circuit 104 operates from the internal power supply VPP. That is, the word-line control circuit 104 does not operate properly unless the potential amplitude of the WL activating signal is converted into the potential amplitude of the internal power supply VPP. FIG. 16 shows a circuit diagram of the potential amplitude converting circuit LS.

The plate-line control circuit 105, which is activated on the basis of, for example, the PL activating signal, controls the potential of the plate lines.

A power supply turning-on sensing circuit 101 senses that the external power supply VDD has been turned on and outputs a power supply starting signal. The power supply starting signal is supplied to the VPP power supply circuit 102 and VINT power supply circuit 103.

Figure 7:
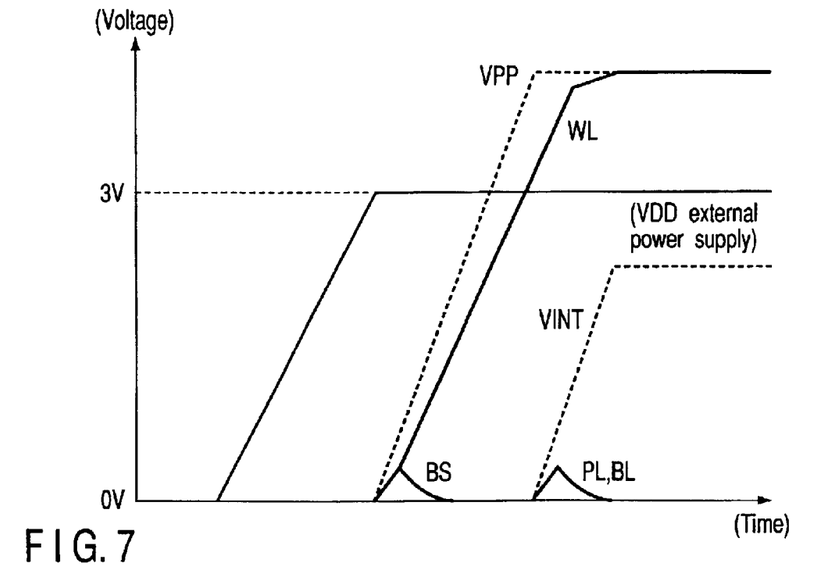
FIG. 7 is a potential waveform diagram showing a potential waveform on each of the word line, block select line, plate line, and bit line immediately after the power supply for the ferroelectric semiconductor memory according to the first embodiment.

The VPP power supply circuit 102 and VINT power supply circuit 103 are started simultaneously on the basis of the power supply starting signal. When the VPP power supply circuit 102 and VINT power supply circuit 103 have been started simultaneously, the potential of the internal power supply VPP and the potential of the internal power supply VINT rise at the same time, as shown in FIG. 7.

The power supply turning-on sensing circuit 101 also senses that the external power supply VDD has been turned on and outputs a reset signal RST. The reset signal RST is supplied to each of the word-line control circuit 104, plate-line control circuit 105, and timing control circuit 106. While the reset signal RST is being supplied to those circuits, the word lines and plate lines are inhibited from being activated.

The reset signal RST is cancelled when the internal power supplies VPP, VINT reach to their setting potential, for example, VPP is 4V and VINT is 2.5V. After the reset signal RST has been cancelled, the word lines and plate lines can be activated, which allows the ferroelectric memory cells arranged in the memory cell array to be accessed.

Figure 17A:
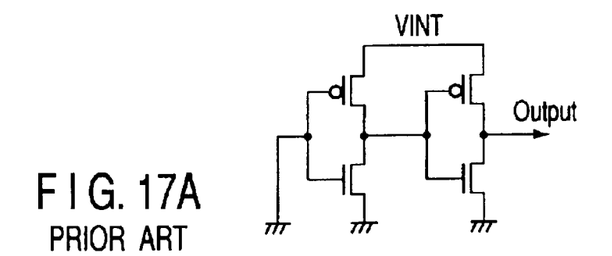
FIG. 17A is a circuit diagram of a logic circuit and FIG. 17B is a potential waveform diagram showing waveforms immediately after the power supply for the logic circuit of FIG. 17A.
Figure 17B:
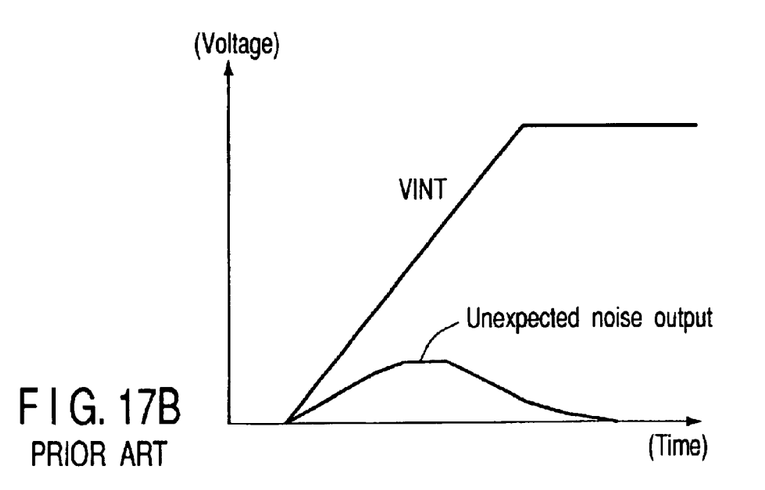

When the internal power supplies VPP, VINT are started from 0V, unexpected noise might occur in the logic circuits to which the power supplies VPP, VINT are supplied. The logic circuits are those included in, for example, the word-line control circuit 104, plate-line control circuit 105, timing control circuit 106, and the like. FIG. 17A shows an example of such a logic circuit. FIG. 17B is a diagram to help explain the way unexpected noise occurs.

As shown in FIG. 17A, the logic circuit in the example includes an inverter whose input is fixed at 0V and an inverter to which the output of the preceding inverter is input. The internal power supply VINT is supplied to each of these inverters.

Since the input to the logic circuit of FIG. 17A is 0V from a logical viewpoint, the output is always at 0V. Actually, however, the output is indefinite until the potential of the internal power supply VINT has risen above the threshold voltage of the transistors included in the logic circuits. As a result, unexpected noise occurs as shown in FIG. 17B.

Figure 18:
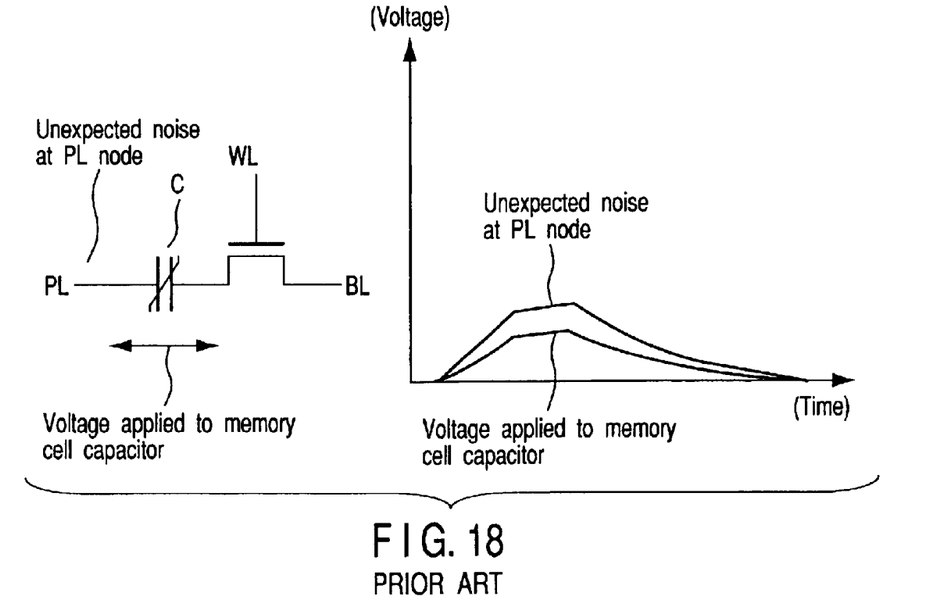
FIG. 18 shows the way a voltage is applied to the ferroelectric capacitor of a ferroelectric semiconductor memory cell.

If unexpected noise occurs in a ferroelectric memory, there is a possibility that the data stored in the ferroelectric memory cells will be destroyed. FIG. 18 shows the way unexpected noise can destroy the stored data.

In the example of FIG. 18, when unexpected noise as explained in FIG. 17B is applied to a plate line PL, a voltage is applied to the ferroelectric capacitor C of the memory cell.

When a voltage is applied across the ferroelectric capacitor C, the amount of polarization, or the stored data, decreases or is destroyed. From this, it can be seen that unexpected noise degrades the data holding characteristic of the ferroelectric memory seriously.

Figure 19:
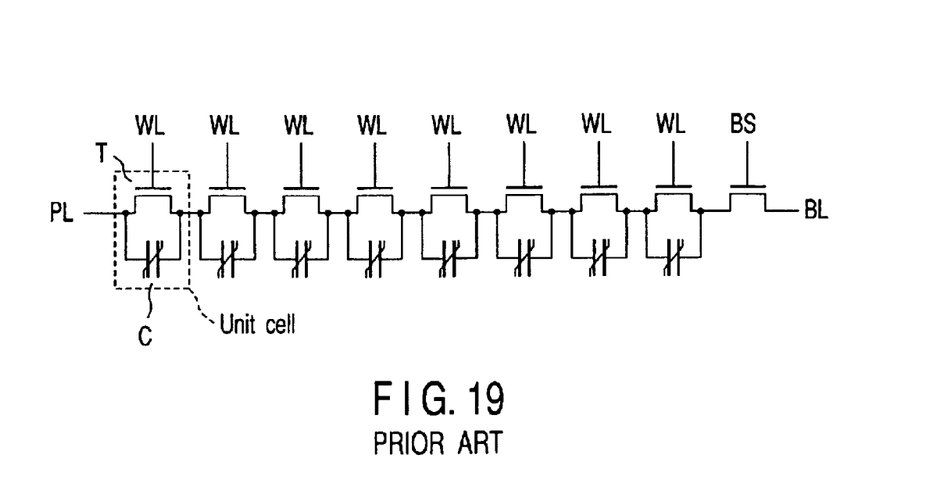
FIG. 19 is a circuit diagram of a series connected TC unit type ferroelectric memory.

The same holds true for a series connected TC unit type ferroelectric memory as shown in FIG. 19. That is, the data holding characteristic deteriorates in a series connected TC unit type ferroelectric memory. The TC parallel unit series-connection ferroelectric memory is obtained by connecting a plurality of unit cells in series, each unit cell including a cell transistor T having a source terminal and a drain terminal and a ferroelectric capacitor C inbetween the two terminals.

Figure 20A:
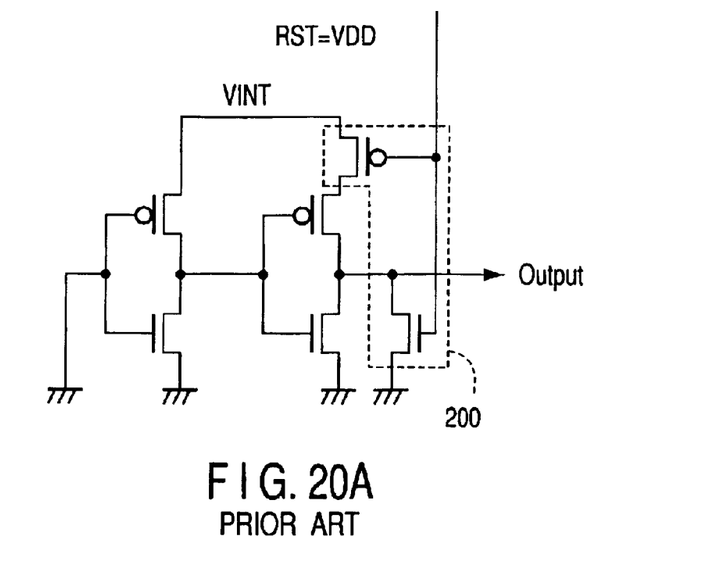
FIG. 20A is a circuit diagram of a logic circuit capable of suppressing noise developing when the power supply is turned on, and FIG. 20B is a potential waveform diagram showing waveforms immediately after the power supply for the logic circuit of FIG. 20A.

To suppress the generation of unexpected noise, the logic circuit shown in FIG. 17A should be replaced with, for example, a logic circuit as shown in FIG. 20A.

Figure 20B:
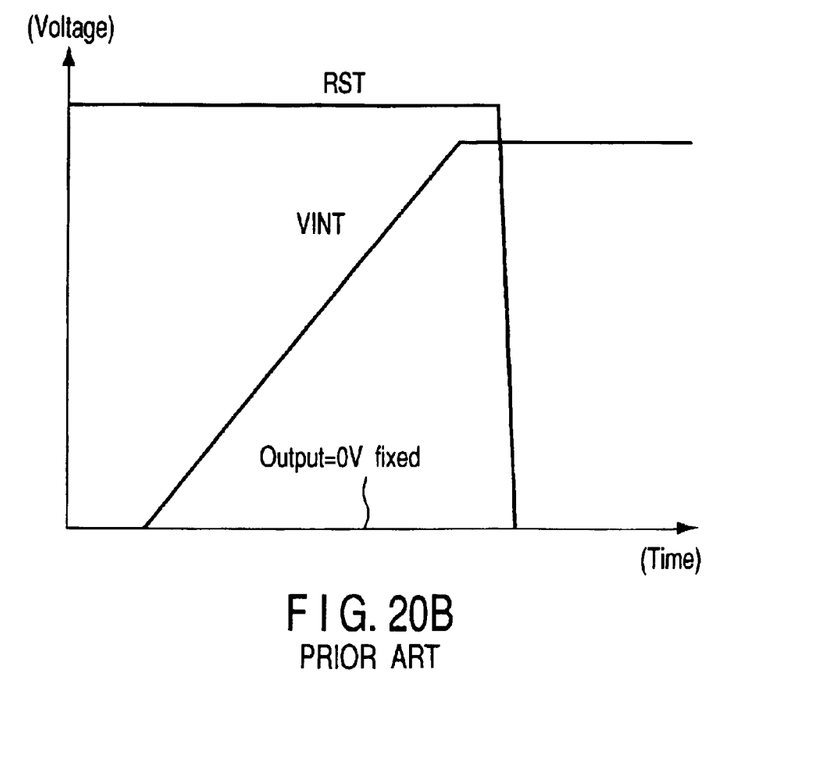

As shown in FIG. 20A, the logic circuit is such that a circuit 200 that fixes the output of the logic circuit at a certain potential is added to the last stage of the logic circuit of FIG. 17A. The circuit 200 fixes the output of the logic circuit at a certain potential, for example, an in-circuit ground potential VSS, on the basis of a reset signal RST. The reset signal RST has a potential higher the internal power supply VINT, such as the potential of the external power supply VDD. In this example, while the reset signal RST of the VDD level is being input, the output of the logic circuit is always fixed at the ground potential GND, or 0V, as shown in FIG. 20B. When the internal power supply VINT rises above the threshold voltage of the transistors and there is no possibility of faulty operations, the reset signal RST may be cancelled, or connected to, for example, ground potential GND.

As described above, for example, the circuit 200 that fixes the output of the logic circuit on the basis of the reset signal RST is added to the last stage of the logic circuit, thereby preventing unexpected noise from occurring when the power supply is turned on. Then, the circuit 200 is built in, for example, the last logic stage of the plate-line driving circuit included in the plate-line control circuit 105. This enables the factor degrading the data holding characteristic due to unexpected noise to be suppressed in the ferroelectric memory.

One known ferroelectric memory controls the internal chip enable signals CE and ICE in response to the external chip enable signal /XCE and power state sense signal POFFL, thereby suppressing memory access to protect the data stored in the ferroelectric memory from being damaged as disclosed in U.S. Pat. No. 5,943,257 (for example, column 11, line 19 to column 13, line 6, FIG. 10 and FIG. 11).

However, there are a good many plate-line driving circuits in the chip. Therefore, incorporating the circuits 200 in the plate-line driving circuits increases the size of the circuit, resulting in an increase in the chip area.

BRIEF SUMMARY OF THE INVENTION

A semiconductor intergraded circuit device according to a first aspect of the present invention comprises: a series connected TC unit type ferroelectric memory which includes series connected memory cells each having a cell transistor having a source terminal and a drain terminal and a ferroelectric capacitor inbetween the two terminals; a first power supply circuit which generates a first power supply potential supplied to the gate of the cell transistor when the cell transistor is in a standby state; and a second power supply circuit which generates a second power supply potential supplied to the source or drain of the cell transistor and starts operating following the start-up of the first power supply circuit after a power supply is turned on.

A semiconductor integrated circuit device according to a second aspect of the present invention comprises: a ferroelectric memory cell which includes a cell transistor and a capacitor; a power supply circuit which generates a power supply potential supplied to the source or drain of the cell transistor; a power supply turning-on sensing circuit which senses the turning on of the power supply and outputs a starting signal to start the power supply circuit; and a delay circuit which delays the starting signal and supplies the delayed signal to the power supply circuit.

A semiconductor integrated circuit device according to a third aspect of the present invention comprises: a ferroelectric memory cell which includes a cell transistor and a capacitor; and a power supply circuit which generates a power supply potential supplied to the source or drain of the cell transistor and which starts operating in a state where the cell transistor is conducting after a power supply is turned on.

A semiconductor integrated circuit device according to a fourth aspect of the present invention comprises: a series connected TC unit type ferroelectric memory which includes series connected memory cells each having a cell transistor having a source terminal and a drain terminal and a ferroelectric capacitor inbetween the two terminals; a first power supply circuit which generates a first power supply potential supplied to the gate of the cell transistor when the cell transistor is in a standby state; and a second power supply circuit which generates a second power supply potential supplied to the source or drain of the cell transistor and starts being deactivated before the first power supply circuit is deactivated after a power supply is turned off.

A semiconductor intergraded circuit device according to a fifth aspect of the invention, comprises: a series connected TC unit type ferroelectric memory which includes series connected memory cells each having a cell transistor having a source terminal and a drain terminal and a ferroelectric capacitor inbetween the two terminals; a first power supply circuit which generates a first power supply potential supplied to the gate of the cell transistor when the cell transistor is in a standby state; and a second power supply circuit which generates a second power supply potential supplied to the source or drain of the cell transistor and which starts operating following the start-up of the first power supply circuit after a power supply is turned on and starts being deactivated before the first power supply circuit is deactivated after the power supply is turned off.

BRIEF DESCRIPTION OF THE SEVERAL VIEWS OF THE DRAWING

FIG. 1 is a potential waveform diagram showing power supply potential waveforms in the chip after the power supply for a ferroelectric semiconductor memory according to a first embodiment of the present invention is turned on;

DETAILED DESCRIPTION OF THE INVENTION

Hereinafter, referring to the accompanying drawings, embodiments of the present invention will be explained.

Like parts are indicated by corresponding reference numerals throughout all of the drawings.

First Embodiment

Figure 5:
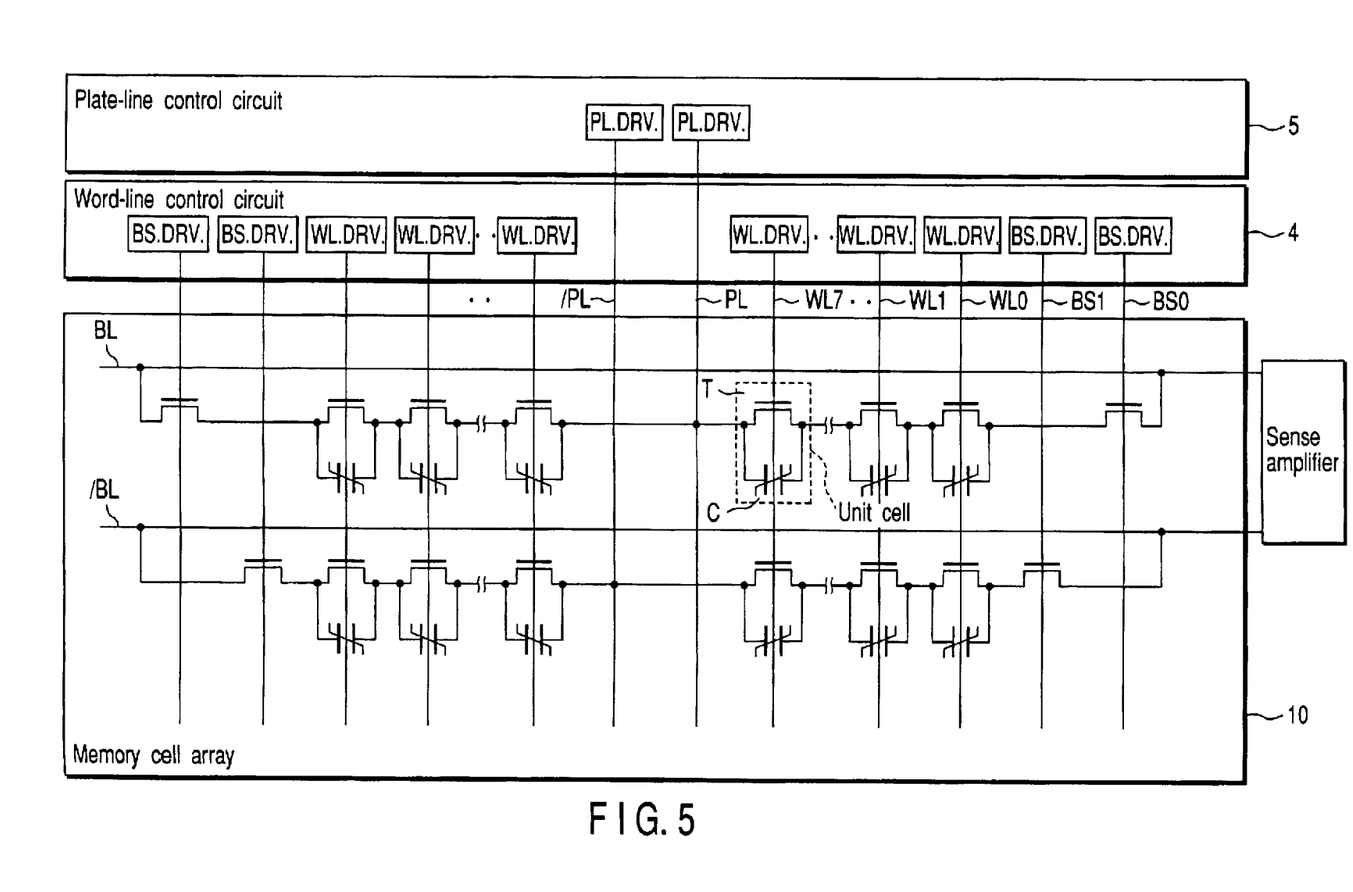
FIG. 5 is a circuit diagram of a memory cell array in the ferroelectric semiconductor memory according to the first embodiment.

A first embodiment of the present invention relates to a series connected TC unit type ferroelectric RAM. FIG. 5 shows a memory cell array included in a series connected TC unit type ferroelectric memory cell.

As shown in FIG. 5, a plurality of series connected TC unit type ferroelectric memory cells are arranged in a memory cell array 10. The series connected TC unit type ferroelectric memory cell is such that a plurality of unit cells are connected in series, each unit cell including, for example, a cell transistor T having a source terminal and a drain terminal and a ferroelectric capacitor C inbetween the two terminals.

In the series connected TC unit type ferroelectric memory, the potential of the word lines (WL0 to WL7) and the potential of the block select lines BS (BS0, BS1) take either the value of the internal power supply VPP or the value of the in-circuit ground potential GND, for example, 0V. In the standby state, for example, the following equations hold: WL=VPP and BS=GND. The potential of the plate lines PL (PL, /PL) takes either the value of the internal power supply VINT or the value of in-circuit ground potential GND. In the standby state, the equation PL=GND holds. To the bit lines BL (BL, /BL), the charge read from a ferroelectric memory cell is transferred. In the standby state, the equation BL=GND holds.

Figure 1:
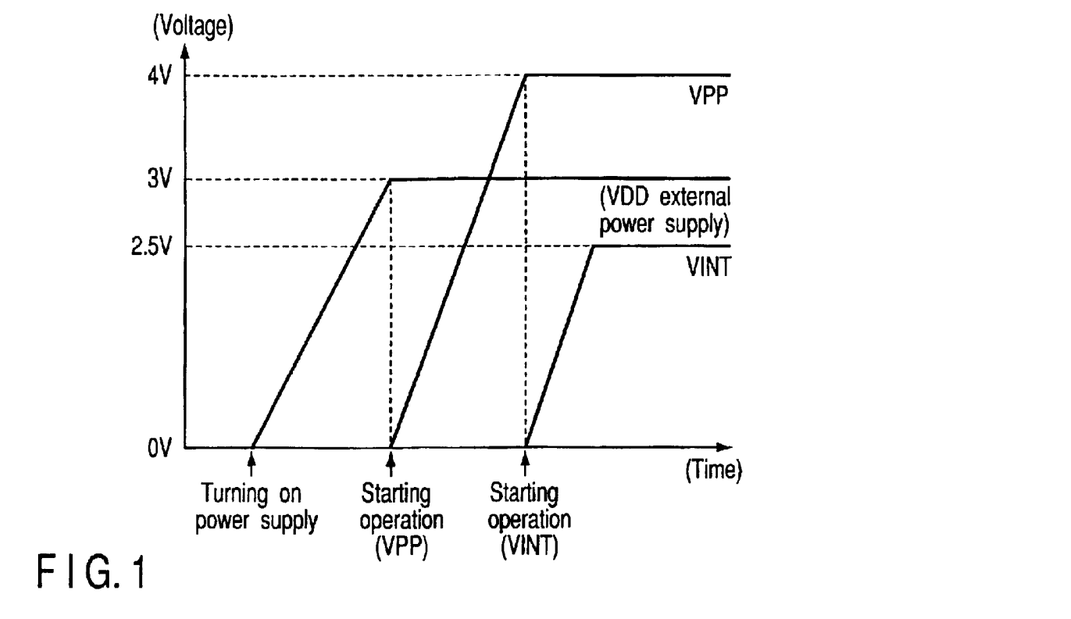

FIG. 1 is a potential waveform diagram showing potential waveforms of the power supply in the chip immediately after the power supply for a ferroelectric semiconductor memory according to the first embodiment is turned on.

As shown in FIG. 1, in the ferroelectric semiconductor memory according to the first embodiment, when an external power supply VDD is turned on and the potential of the external power supply VDD rises from 0V to a certain potential, for example, 3V, a VPP power supply circuit is started. After the VPP power supply is started, the potential of the internal power supply VPP starts to rise toward its setting potential. The setting potential of the internal power supply VPP is, for example, 4V. In the embodiment, a VINT power supply circuit is not started until the potential of the internal power supply VPP has reached a sufficiently high potential. Therefore, the potential of the internal power supply VINT is at the in-circuit ground potential GND, for example, 0V until the potential of the internal power supply VPP has reached a sufficiently high potential. When the potential of the internal power supply VPP has reached a sufficiently high potential, or a setting potential, for example, 4V, the VINT power supply circuit is started. After the VINT power supply is started, the potential of the internal power supply VINT starts to rise toward its setting potential. The setting potential of the internal power supply VINT is, for example, 2.5V.

Figure 2:
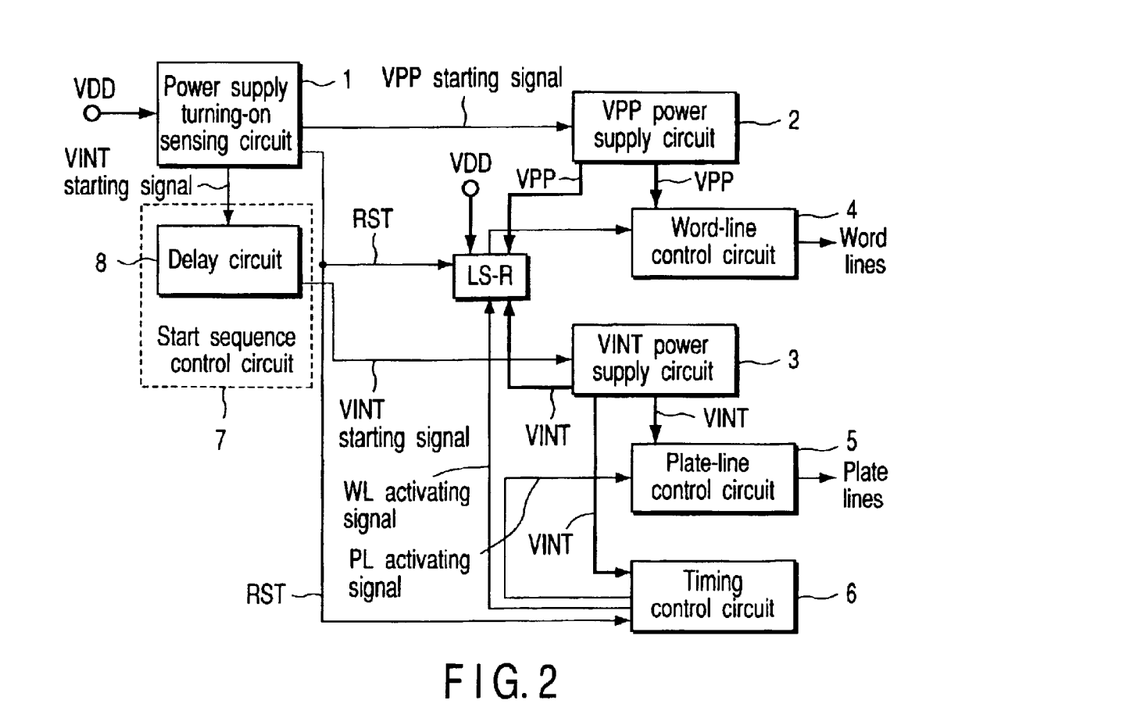
FIG. 2 is a block diagram showing a configuration of the ferroelectric semiconductor memory according to the first embodiment.

FIG. 2 is a schematic block diagram showing a configuration of the ferroelectric semiconductor memory according to the first embodiment. Of the circuits included in the ferroelectric semiconductor memory, FIG. 2 shows only the main power supply circuits and the important circuits related to the power supply circuits.

As shown in FIG. 2, the primary power supply circuits and the important related to the power supply circuits include, for example, a power supply turning-on sensing circuit 1, a VPP power supply circuit 2, a VINT power supply circuit 3, a word-line control circuit 4, a plate-line control circuit 5, and a timing control circuit 6.

As shown in FIG. 2, the VPP power supply circuit 2 generates an internal power supply VPP. The internal power supply VPP is supplied to, for example, the word lines and the word-line control circuit 4 that controls the word lines.

The VINT power supply circuit 3 generates an internal power supply VINT. The internal power supply VINT is supplied to, for example, the plate lines, the plate-line control circuit 5 that controls the plate lines, and a logic circuit group that controls the operation of the entire chip, for example, the timing control circuit 6.

The timing control circuit 6 outputs, for example, a WL activating signal and a PL activating signal. The WL activating signal is supplied to the word-line control circuit 4. The PL activating signal is supplied to the plate-line control circuit 5.

The word-line control circuit 4, which is activated on the basis of, for example, the WL activating signal, controls the potential of the word lines. Before being supplied to the word-line control circuit 4, the WL activating signal passes through a potential amplitude converting circuit LS-R. As in the prior art, the reason for this is that the timing control circuit 6 operates from the internal power supply VINT and the word-line control circuit 4 operates from the internal power supply VPP.

The plate-line control circuit 5, which is activated on the basis of, for example, the PL activating signal, controls the potential of the plate lines.

The power supply turning-on sensing circuit 1 senses that the external power supply VDD has been turned on and outputs a power supply starting signal. In the embodiment, the power supply turning-on sensing circuit 1 outputs, for example, two power-supply starting signals, a VPP starting signal and a VINT starting signal. The VPP starting signal is supplied to the VPP power supply circuit 2. The VINT starting signal is supplied to a start sequence control circuit 7.

Figure 3:
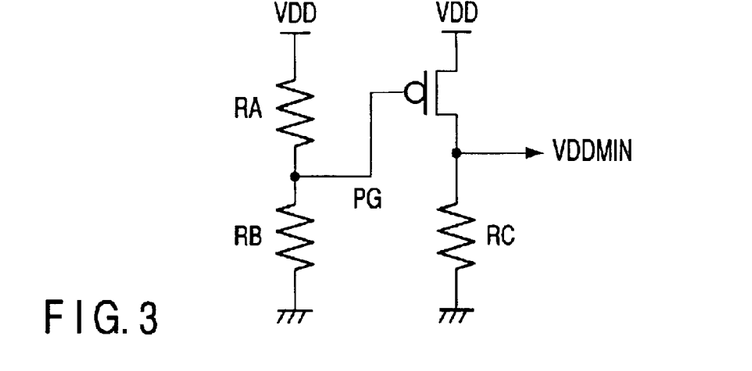
FIG. 3 is a circuit diagram of a power supply turning-on circuit.

FIG. 3 is a circuit diagram of the power supply turning-on circuit 1.

As shown in FIG. 3, when the potential of the VDD rises from zero, the potential of node PG is determined by the ratio of two resistances RA, RB. The potential of the PG rises as the potential of the VDD rises. When the potential of the VDD has risen until the VDD-PG potential difference has risen just beyond the threshold value of the PMOS transistor, the transistor becomes conductive, bringing the output VDDMIN into a high state. When the potential of the VDD has dropped and the VDD-PG potential difference has dropped below the threshold voltage of the PMOS transistor, the output potential VDDMIN goes low, since the potential of the output node VDDMIN is discharged via a resistance element RC. This makes it possible to sense that the power supply voltage VDD is higher than a certain voltage.

The start sequence control circuit 7 controls the order in which the VPP power supply circuit 2 and VINT power supply circuit 3 are started. In the embodiment, the start sequence control circuit 7 controls the start sequence in such a manner that the VINT power supply circuit 3 is started when the potential of, for example, the internal power supply VPP has become sufficiently high in potential after the start-up of the VPP power supply circuit 2.

Figure 4:
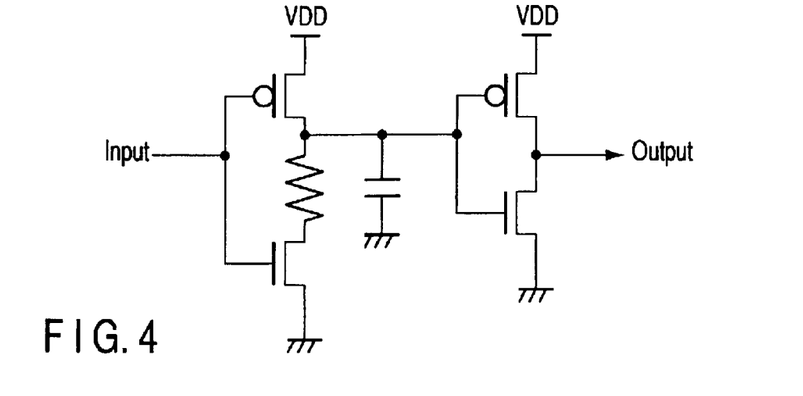
FIG. 4 is a circuit diagram of a delay circuit.

The start sequence control circuit 7 includes, for example, a delay circuit 8. The delay circuit 8 delays the VINT starting signal. The starting signal VINT is delayed with respect to, for example, the starting signal VPP. This enables the VINT power supply circuit 3 to be controlled in such a manner that the VINT power supply circuit 3 is started after the potential of the internal power supply VPP has reached a sufficiently high potential, for example, 4V.

FIG. 4 is a circuit diagram of the delay circuit.

As shown in FIG. 4, the delay circuit is constructed by inserting a resistance element and a capacitance element in a train of inverters driven by the external power supply VDD. When the input changes from the high to the low level, the charge accumulated in the capacitance element is discharged via the resistance element, which lengthens the transfer time from the input to the output as compared with the transfer time in a configuration of only simple inverters. This realizes a delay in the transfer from the input to the output.

The VPP power supply circuit 2 is started on the basis of the VPP starting signal. The VINT power supply circuit 3 is started on the basis of the VINT starting signal coming by way of the start sequence control circuit 7. As a result, after the internal power supply VPP has reached a sufficiently high potential, the potential of the internal power supply VINT starts to rise as shown in FIG. 1.

The power supply turning-on circuit 1 senses that the external power supply VDD has been turned on and outputs a reset signal RST for a specific length of time. The reset signal RST is supplied to, for example, the timing control circuit 6 and potential amplitude converting circuit LS-R.

The time during which the reset signal is output is, for example, shorter than 1 millisecond after the power supply is turned on. During the time shorter than one millisecond, for example, the start-up of the VPP power supply circuit 2 and the VINT power supply circuit 3 is completed. The completion of the start-up means that the potential of the internal power supply VPP and VINT have reached their respective setting potentials, for example, VPP=4V and VINT=2.5V, which allows the ferroelectric memory cells arranged in the memory cell array to be accessed.

Figure 6:
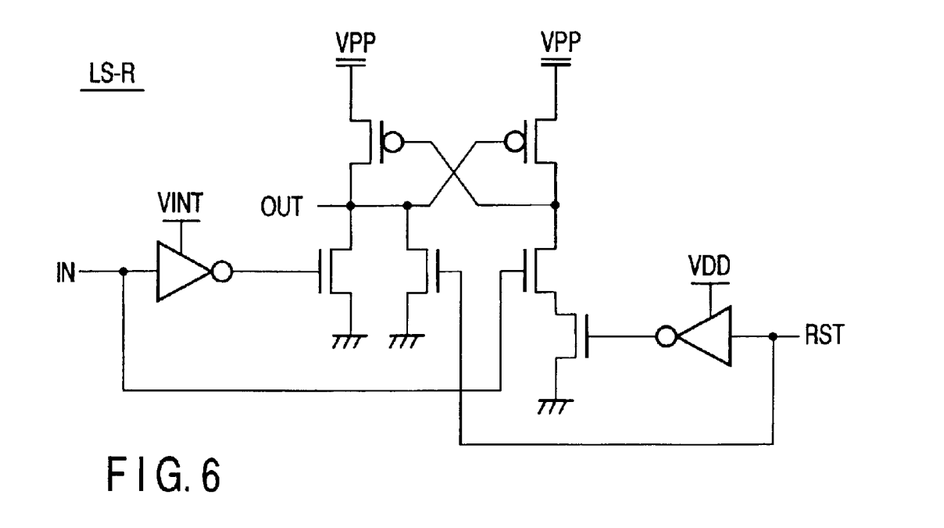
FIG. 6 is a circuit diagram of a potential amplitude converting circuit included in the ferroelectric semiconductor memory according to the first embodiment.

FIG. 6 is a circuit diagram of the potential amplitude converting circuit LS-R included in the ferroelectric semiconductor memory according to the first embodiment.

The potential amplitude converting circuit LS-R is one of the logic circuits included in the logic circuit group to which the internal power supply VPP is supplied.

In the potential amplitude converting circuit LS-R of FIG. 6, when the reset signal RST is at a high level, for example, RST=VDD, the potential of the output OUT is kept at the in-circuit ground potential GND, for example, 0V, regardless of the potential state of input IN. Consequently, even if the VINT power supply circuit 3 is not started and the state of the WL activating signal from the timing control circuit 6 is unstable, the WL activating signal input to the word-line control circuit 4 can be kept in the initial state. Thus, when the reset signal RST meets, for example, the equation RST=VDD, the potential of the WL activating signal input to the word-line control circuit 4 can be kept at a potential that brings the word lines into the reset state, for example, the potential of the gate of a cell transistor into the standby state, regardless of the potential of the WL activating signal from the timing control circuit.

Furthermore, the reset signal RST is supplied to the timing control circuit 6. Thus, when the reset signal RST meets, for example, the equation RST=VDD, the potential of the PL activating signal input to the plate-line control circuit 5 can be kept at a potential that brings the plate lines into the reset state, for example, the potential of the source or drain of a cell transistor into the standby state.

Unlike the reset signal RST in a conventional equivalent, the reset signal RST in the ferroelectric semiconductor memory of the first embodiment is not input to the word-line driving circuit WL.DRV. and block select-line driving circuit BS.DRV. at the last logic stage included in the word-line control circuit 4 as shown in, for example, FIG. 5. As a result, there is a possibility that unexpected noise will be applied to the word lines at the beginning of the start-up of the VPP power supply circuit 2.

Similarly, the reset signal RST is not input to the plate-line driving circuit PL.DRV. at the last logic stage included in the plate-line control circuit 5. As a result, there is a possibility that unexpected noise will be applied to the plate lines at the beginning of the start-up of the VINT power supply circuit 3.

In the ferroelectric semiconductor memory of the first embodiment, the possibility that the data stored in the ferroelectric memory cells will be destroyed by unexpected noise is suppressed. FIG. 7 shows how the possibility of unexpected noise destroying the stored data is suppressed.

FIG. 7 shows not only the potentials of the internal power supplies VPP, VINT but also the change of the potential of each node in the memory cell array shown in FIG. 5.

The word lines WL and block select lines BS are driven by the internal power supply VPP and the plate lines PL and bit lines BL are driven by the internal power supply VINT.

In the ferroelectric semiconductor memory of the first embodiment, the internal power supply VPP is first activated as shown in FIG. 1. As a result, the word lines WL and block select lines BS are set to the potential of the standby state, satisfying, for example, the equations WL=VPP, BS=GND as shown in FIG. 7. At the beginning of the start-up of the VPP power supply circuit, there is a possibility that unexpected noise will be applied to the word lines WL and the block select lines BS. The unexpected noise, however, is prevented from destroying the data stored in the ferroelectric memory cells.

After the potential of the word lines WL become sufficiently high, the two nodes of the ferroelectric capacitor C, or the two electrodes of the ferroelectric capacitor C, are electrically kept at the same potential as a result of the cell transistor conducting, as seen from the configuration of the memory cell array shown in FIG. 5. Consequently, even if the potential of the plate lines PL or bit liens BL fluctuates a little, the data in the memory cells will not be destroyed, provided that the potential of the word lines WL is sufficiently high.

Second Embodiment

Figure 9:
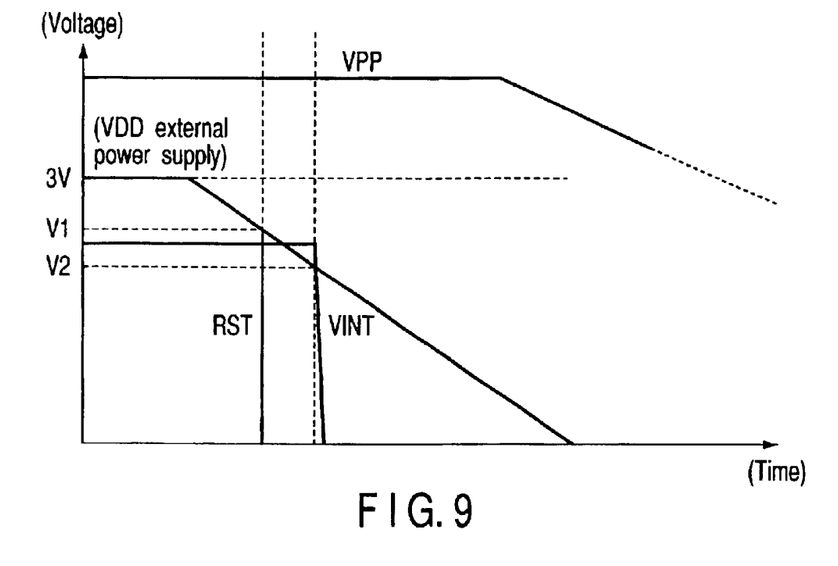
FIG. 9 is a waveform diagram showing power supply potential waveforms in the chip after the power supply for a ferroelectric semiconductor memory according to a second embodiment of the present invention.

FIG. 9 shows internal power supply waveforms when a power supply according to a second embodiment of the present invention is turned off.

Like the first embodiment, the second embodiment relates to a ferroelectric memory device including the TC parallel unit series-connection ferroelectric memory cells shown in FIG. 5.

Figure 10:
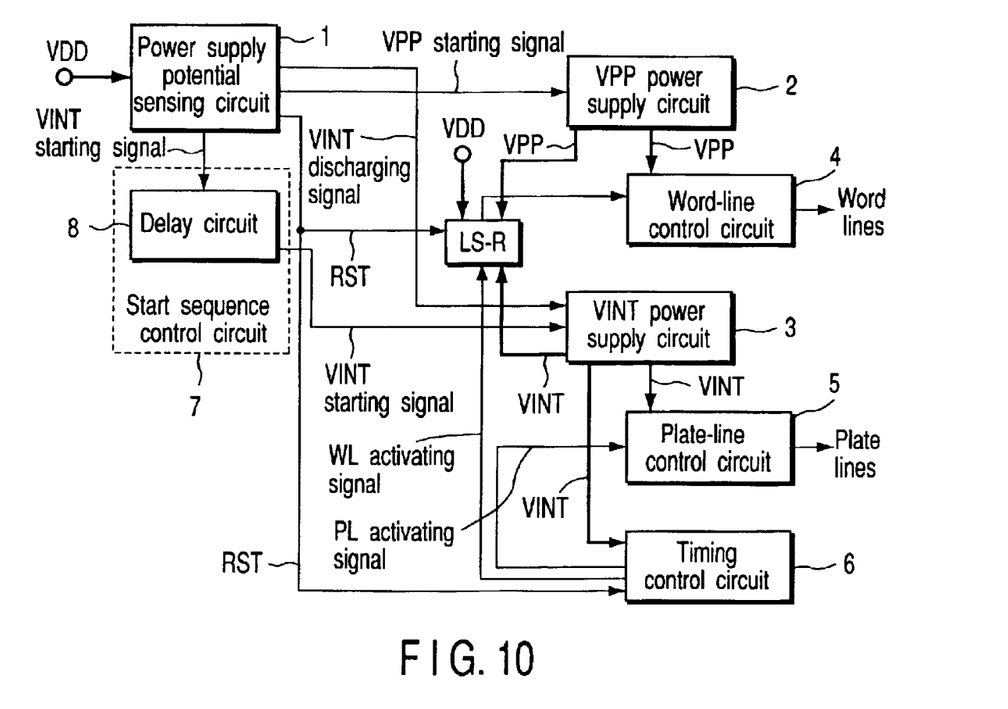
FIG. 10 is a block diagram showing a configuration of the ferroelectric semiconductor memory according to the second embodiment.

FIG. 10 is a block diagram of a ferroelectric memory according to the second embodiment.

As shown in FIG. 10, the second embodiment differs from the first embodiment in that a power supply potential sensing circuit 1' substitutes for the power supply turning-on sensing circuit 1.

Like the power supply turning-on sensing circuit 1 explained in the first embodiment, the power supply potential sensing circuit 1' senses that the external power supply VDD has been turned on and outputs a VPP starting signal and a VINT starting signal and further outputs a reset signal RST for a specific length of time to keep the circuit in the reset state. In addition, the power supply potential sensing circuit 1' senses that the external power supply VDD has been turned off and generates a reset signal RST when the potential of the external power supply VDD has dropped below a first specific potential V1. Furthermore, when the potential of the external power supply VDD has dropped below a second specific potential V2 lower than the first specific potential V1, the power supply potential sensing circuit 1' outputs a VINT discharging signal.

When receiving the VINT discharging signal, the VINT generating circuit 3 is deactivated and the internal power supply VINT is short-circuited to the ground potential GND. That is, the internal power supply VINT is controlled so as to meet the equation VINT=0V.

The internal power supply VINT has a potential that drives the plate lines and bit lines as explained in the first embodiment. At this time, since the internal power supply VPP that drives the word lines has not been discharged and the reset signal is activated, the potential of the word lines is reset to the standby state VPP and kept sufficiently high until the internal power supply VINT is discharged and becomes equal to the ground potential GND.

In the second embodiment, after the internal power supply VINT is discharged and drops to the ground potential GND, the potential of the internal power supply VPP is discharged naturally and gradually falls. After the internal power supply VINT drops to the ground potential GND, no electric power to drive the plate lines and bit lines is left, which prevents a voltage from being applied across the memory capacitor, even when the potential of the internal power supply VPP gets lower and therefore the word line potential of the memory cells becomes lower. Consequently, the data is not destroyed.

Third Embodiment

Figure 11:
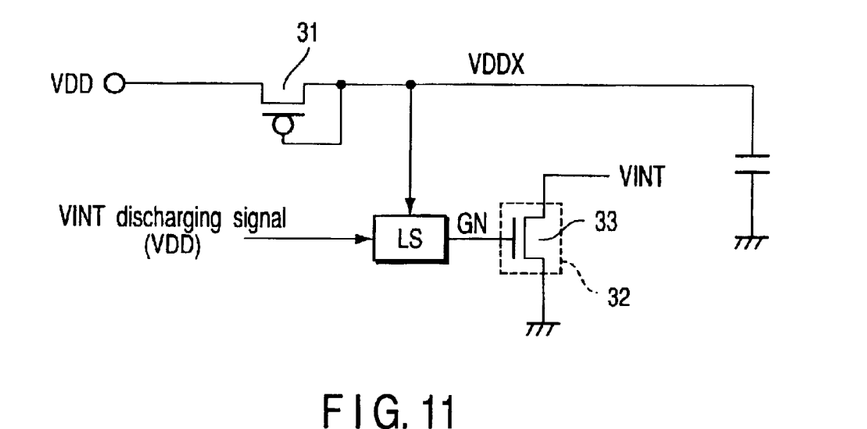
FIG. 11 is a block diagram of a ferroelectric semiconductor memory according to a third embodiment of the present invention.

FIG. 11 shows a third embodiment of the present invention. The third embodiment relates to a circuit which controls the discharging of the internal power supply VINT to the ground potential GND.

The source of a PMOS transistor 31 is connected to a power supply line to which an external power supply VDD is supplied. The gate and drain of the PMOS transistor are short-circuited and then connected to an internal power supply line VDDX. As a result, the potential of the internal power supply line VDDX is kept at (VDD−VTH) lower than the external power supply VDD by about the threshold value VTH of the PMOS transistor. A VINT discharging signal is supplied to a potential amplitude converting circuit LS. The potential amplitude converting circuit LS converts the VINT discharging signal with the potential amplitude of the external power supply VDD into a signal GN with the potential amplitude of the internal power supply VDDX. This enables a discharging circuit 32 that discharges the potential of the internal power supply VINT to the ground potential GND to be driven by the signal GN with the potential amplitude of the internal power supply VDDX. The discharging circuit 32 includes, for example, an NMOS transistor 33 whose gate receives the signal GN. The NMOS transistor 33 has its source connected to a supply terminal at the ground potential GND and its drain connected to a supply terminal at the internal power supply VINT.

Figure 12:
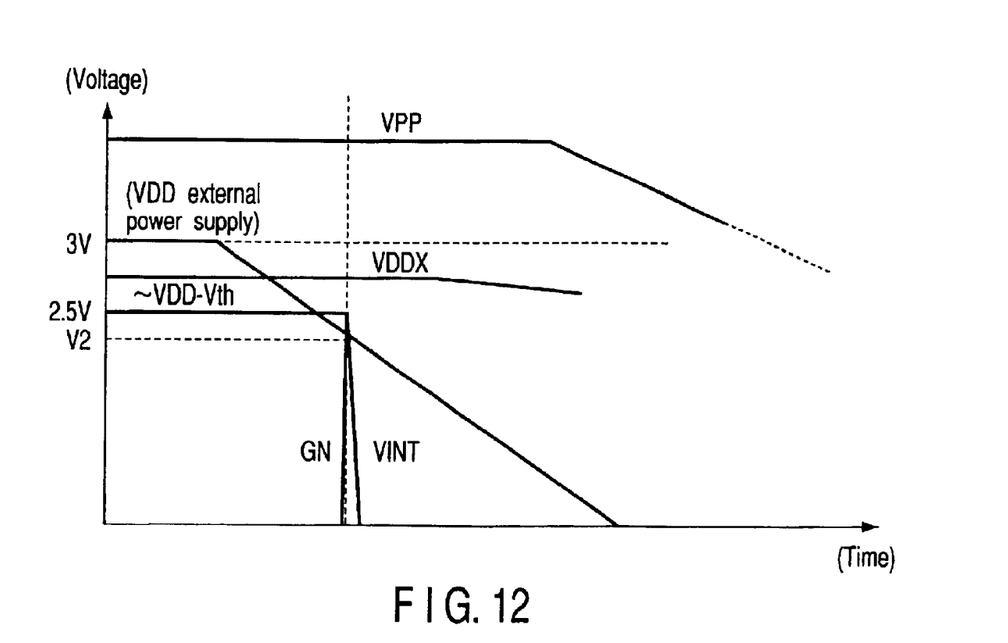
FIG. 12 is a waveform diagram showing power supply potential waveforms in the chip after the power supply for the ferroelectric semiconductor memory according to the third embodiment.

FIG. 12 is an operating waveform diagram to help explain the operation of the circuit related to the third embodiment.

As shown in FIG. 12, in the third embodiment, even if the potential of the external power supply VDD drops below a second specific potential V2, the potential of the internal power supply VDDX will not be lower than (VDD−VTH).

Accordingly, in the third embodiment, even if the potential of the external power supply VDD drops very quickly to ground potential GND, it is possible to discharge the potential of the internal power supply VINT properly to the ground potential GND.

Fourth Embodiment

Figure 13:
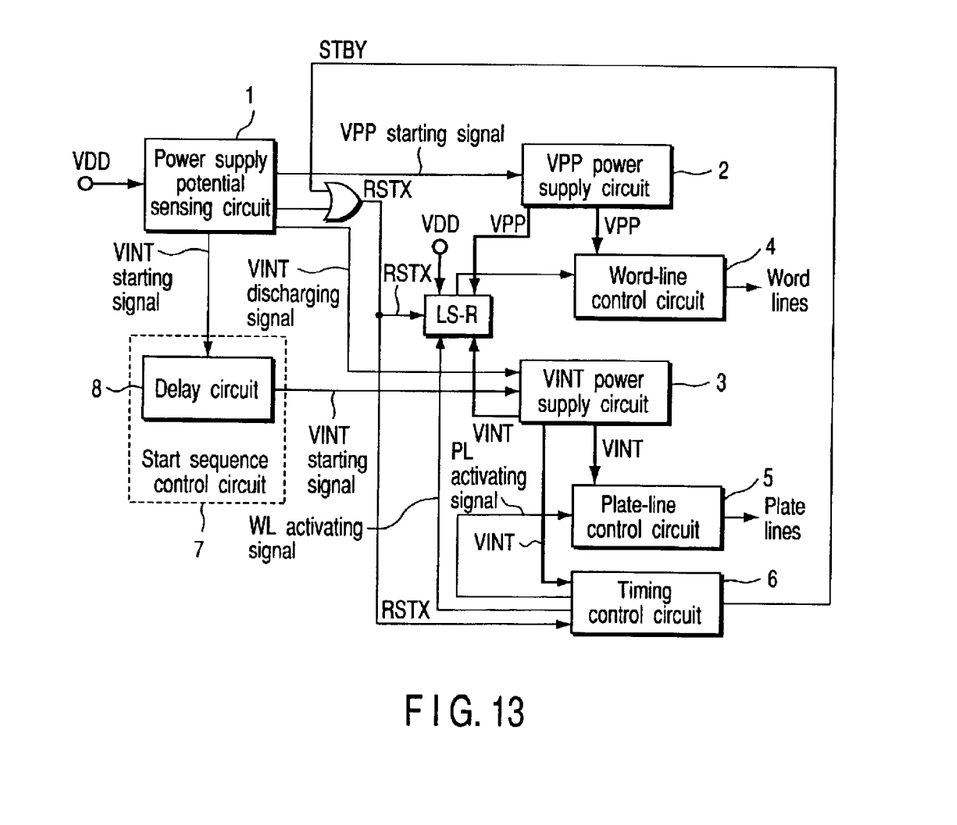
FIG. 13 is a block diagram of a ferroelectric memory according to a fourth embodiment of the present invention.

FIG. 13 is a block diagram of a ferroelectric memory according to a fourth embodiment of the present invention.

In the fourth embodiment, when the power supply voltage VDD drops below a first specific potential V1, a reset signal RST is generated as explained in the first embodiment. In the above embodiments, the RST signal is a signal that keeps the entire circuit in the standby state.

When the reset signal is generated and the word lines, plate lines, and the like are forced to be in the standby state, while the chip is being accessed, the access will possibly not be completed properly. As a result, the data in the memory cells can be destroyed.

To overcome this problem, the fourth embodiment is so configured that a logical add signal RSTX of a signal RST generated when the power supply VDD drops below the first specific potential V1 and a signal STBY indicating that the chip is in the standby state is connected as a reset signal to each circuit. The signal STBY is generated by a timing control circuit and activated when the chip is not accessed.

With the configuration of the fourth embodiment, when the chip is being accessed and the signal STBY is not generated, the signal RST or signal RSTX becomes effective after the access is completed and the chip goes into the standby state. This prevents the data from being destroyed as a result of the chip being reset forcibly in the middle of an access.

This invention is not limited to the first to fourth embodiments and may be practiced or embodied in still other ways without departing from the spirit or essential character thereof.

For instance, while in the embodiments, the power supply turning-on sensing circuit 1 outputs two signals, the VPP starting signal and VINT starting signal, the power supply turning-on sensing circuit 1 may be modified so as to output a single power supply starting signal. In this case, for example, the single power supply starting signal is supplied directly to the VPP power supply circuit 2 and further supplied to the VINT power supply circuit 3 by way of the start sequence control circuit 7. As in the aforementioned embodiments, one example of the start sequence control circuit 7 includes a delay circuit that delays the time that the power supply starting signal reaches the VINT power supply circuit 3 with respect to the time that the power supply starting signal reaches the VPP power supply circuit 2. This configuration provides similar advantages to those of the above embodiments, even when the single power supply starting signal is used.

The power supply potential sensing circuit in each of the second to fourth embodiments senses the turning on of the power supply and the turning off of the power supply. Alternatively, a circuit that senses the turning on of the power supply and a circuit that senses the turning off of the power supply may be provided separately.

Figure 8:
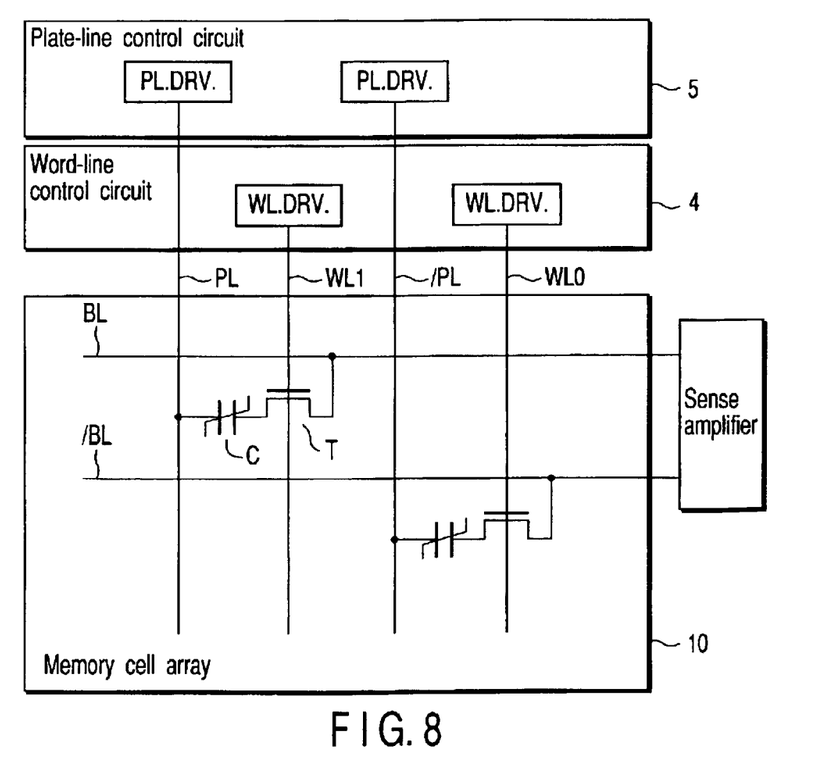
FIG. 8 is a circuit diagram of another example of the memory cell array in the ferroelectric semiconductor memory.

In the above embodiments, a series connected TC unit type ferroelectric memory cell is used as a ferroelectric semiconductor memory. Furthermore, the present invention may be applied to a ferroelectric memory including single-transistor-single-capacitor ferroelectric memory cells, each being composed of a cell transistor T and a ferroelectric capacitor C connected in series as shown in FIG. 8.

The above embodiments include various stages of the invention. It is possible to extract various stages of the invention by suitably combining a plurality of structural requirements disclosed in the embodiments.

Furthermore, while in the embodiments, the invention has been applied to a ferroelectric semiconductor memory, it may be applied to a semiconductor integrated circuit device incorporating a ferroelectric semiconductor memory as described above, such as a processor or a system LSI.

As has been described above, with the first to fourth embodiments, it is possible to provide a semiconductor integrated circuit device including a ferroelectric semiconductor memory capable of suppressing deterioration of the data holding characteristic while suppressing an increase in circuit size.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor integrated circuit device comprising:
   a series connected TC unit type ferroelectric memory which includes series connected memory cells each having a cell transistor having a source terminal and a drain terminal and a ferroelectric capacitor inbetween the two terminals;
   a first power supply circuit which generates a first power supply potential supplied to a gate of the cell transistor when the cell transistor is in a standby state; and
   a second power supply circuit which generates a second power supply potential supplied to the source or drain of the cell transistor and starts operating following a start-up of the first power supply circuit after a power supply is turned on.

2. The semiconductor integrated circuit device according to claim 1, further comprising:
   a power supply turning-on sensing circuit which senses the turning on of the power supply and outputs a reset signal for a specific length of time;
   a first logic circuit group to which the first power supply potential is supplied and which has at least part of a logic circuits included therein fix their outputs at a certain potential; and
   a second logic circuit group to which the second power supply potential is supplied.

3. The semiconductor integrated circuit device according to claim 1, further comprising:
   a power supply turning-on sensing circuit which senses the turning on of the power supply and generates a reset signal for a specific length of time;
   a timing control circuit which outputs a word-line activating signal; and
   a word-line control circuit which is activated on the basis of the word-line activating signal and controls a potential of the gate of the cell transistor and which keeps a potential of the word-line activating signal at a potential that brings the potential of the gate of the cell transistor into a standby state according to the reset signal, regardless of the potential of the word-line activating signal from the timing control circuit.

4. The semiconductor integrated circuit device according to claim 1, further comprising:
   a power supply turning-on sensing circuit which senses the turning on of the power supply and generates a reset signal for a specific length of time;
   a timing control circuit which outputs a word-line activating signal;
   a potential amplitude converting circuit which converts a potential amplitude of the word-line activating signal from a potential amplitude corresponding to the second power supply potential to a potential amplitude corresponding to the first power supply potential and which keeps the potential of the word-line activating signal at a level that brings the potential of the gate of the cell transistor into a standby state according to the reset signal, regardless of the potential of the word-line activating signal from the timing control circuit; and a word-line control circuit which is activated on the basis of the word-line activating signal passed through the potential amplitude converting circuit.

5. The semiconductor integrated circuit device according to claim 2, wherein a specific length of time is shorter than one millisecond.

6. The semiconductor integrated circuit device according to claim 2, wherein the reset signal is cancelled after a start-up of the second power supply circuit is completed.

7. The semiconductor integrated circuit device according to claim 1, further comprising:
a start sequence control circuit which begin the start-up of the second power supply circuit after the start-up of the first power supply circuit.

8. The semiconductor integrated circuit device according to claim 7, further comprising:
a power supply turning-on sensing circuit which senses the turning on of the power supply and outputs a first starting signal to start the first power supply circuit and a second starting signal to start the second power supply circuit, wherein
the start sequence control circuit includes a delay circuit which delays the second starting signal.

9. The semiconductor integrated circuit device according to claim 7, further comprising:
a power supply turning-on sensing circuit which senses the turning on of the power supply and outputs a power supply starting signal to start the first power supply circuit and the second power supply circuit, wherein
the start sequence control circuit includes a delay circuit which delays a time that the power supply starting signal reaches the second power supply circuit with respect to a time that the power supply starting signal reaches the first power supply circuit.

10. The semiconductor integrated circuit device according to claim 1, further comprising:
a timing control circuit which outputs a word-line activating signal and a plate-line activating signal;
a word-line control circuit which is activated on the basis of the word-line activating signal and controls the potential of the gate of the cell transistor; and
a plate-line control circuit which is activated on the basis of the plate-line activating signal and controls the potential of the source or drain of the cell transistor, wherein
the first power supply potential is supplied to the word-line control circuit and the second power supply potential is supplied to the timing control circuit and the plate-line control circuit.

11. A semiconductor integrated circuit device comprising:
a ferroelectric memory cell which includes a cell transistor and a capacitor;
a power supply circuit which generates a power supply potential supplied to a source or drain of the cell transistor;
a power supply turning-on sensing circuit which senses a turning on of the power supply and outputs a starting signal to start the power supply circuit;
a delay circuit which delays the starting signal and supplies a delayed signal to the power supply circuit;

a timing control circuit which outputs a word-line activating signal and a plate-line activating signal;
a word-line control circuit which is activated on the basis of the word-line activating signal and controls a potential of a gate of the cell transistor; and
a plate-line control circuit which is activated on the basis of the plate-line activating signal and controls a potential of the source or drain of the cell transistor wherein
the power supply potential is supplied to the timing control circuit and the plate-line control circuit.

12. A semiconductor integrated circuit device comprising:
a ferroelectric memory cell which includes a cell transistor and a capacitor;
a power supply circuit which generates a power supply potential supplied to a source or drain of the cell transistor and which starts operating in a state where the cell transistor is conducting after a power supply is turned on;
a timing control circuit which outputs a word-line activating signal and a plate-line activating signal;
a word-line control circuit which is activated on the basis of the word-line activating signal and controls a potential of a gate of the cell transistor; and
a plate-line control circuit which is activated on the basis of the plate-line activating signal and controls a potential of the source or drain of the cell transistor, wherein
the power supply potential is supplied to the timing control circuit and the plate-line control circuit.

13. The semiconductor integrated circuit device according to claim 1, further comprising:
a power supply potential sensing circuit which senses when the power supply has been turned off and deactivates the second power supply circuit, thereby discharging the potential of the second power supply potential to ground potential.

14. The semiconductor integrated circuit device according to claim 13, wherein the power supply potential sensing circuit generates a reset signal to keep a control signal for controlling the memory cell in a standby state when the potential of the power supply drops below a first potential and generates a discharging signal to discharge the second power supply potential to ground potential when the potential of the power supply drops below a second potential lower than the first potential.

15. The semiconductor integrated circuit device according to claim 13, further comprising:
a p-channel transistor to whose source the potential of the power supply is supplied and whose drain and gate are connected to a power supply line with a third power supply potential; and
a circuit which is driven at the third power supply potential and discharges the second power supply potential to ground potential.

16. The semiconductor integrated circuit device according to claim 14, further comprising:
a circuit which generates a standby signal indicating that the memory cell is in a standby state, wherein
the reset signal is effective when the standby signal is indicating the standby state.

* * * * *